United States Patent [19]

Volk et al.

[11] Patent Number: 4,546,472
[45] Date of Patent: Oct. 8, 1985

[54] METHOD AND MEANS FOR TESTING INTEGRATED CIRCUITS

[75] Inventors: Andrew Volk; Christopher McAfee, both of San Jose,, Calif.

[73] Assignee: Intel Corporation, Santa Clara, Calif.

[21] Appl. No.: 461,408

[22] Filed: Jan. 27, 1983

[51] Int. Cl.⁴ .................. G01R 31/28; G06F 11/00
[52] U.S. Cl. .................. 371/15; 324/73 R; 371/25; 371/27
[58] Field of Search .............. 371/25, 15, 27; 324/73 R, 73 AT, 73 PC

[56] References Cited

U.S. PATENT DOCUMENTS

| | | | |
|---|---|---|---|
| 3,657,527 | 4/1972 | Kassabgi et al. | 371/25 |
| 3,714,571 | 1/1973 | Walker | 371/25 X |
| 3,976,940 | 8/1976 | Chau et al. | 324/73 R |
| 4,092,589 | 5/1978 | Chau et al. | 324/73 R |
| 4,176,258 | 11/1979 | Jackson | 371/25 X |

OTHER PUBLICATIONS

A. Mastrocola, Effective Utilization of In-Circuit Techniques When Testing Complex Digital Assemblies, Automatic Testing & Test and Measurement 1981, Conference, Weisbaden, W. Germany, Mar. 1981, pp. 106–117.

Primary Examiner—Charles E. Atkinson
Attorney, Agent, or Firm—Owen L. Lamb

[57] ABSTRACT

Data processing logic (10) is fabricated on an integrated circuit device and is outputted to a plurality of output pins (1−N). A number of these pins (34, 36, 38) which are normally function outputs, and a reset pin (24), are used to invoke a test state on the integrated circuit device. Test control logic generates two test flags (TA, TB) in response to test signals on two of these pins (34, 36). These two test flags are decoded (14, 18, 20, 22) to control all signal output pins (1−N) from the integrated circuit device by forcing a high-level, low-level, or high-impedance condition, as selected by external stimulus at the output pins, regardless of the condition of the internal circuitry on the integrated circuit device. A test flag TC (60) is generated in response to a test signal on pin (38). This TC flag is used to signal the data processing logic (10) to initiate a functional self-check operation.

14 Claims, 2 Drawing Figures

METHOD AND MEANS FOR TESTING INTEGRATED CIRCUITS

BACKGROUND OF INVENTION

1. Field of the Invention

The invention relates to integrated circuits and more particularly to a method and means for the electrical and functional testing of integrated circuits.

2. Description of The Prior Art

In the past, tests made during manufacturing have been utilized to aid in the debugging and testing of integrated circuits both by themselves and after they have been soldered onto a circuit board along with other integrated circuits. The procedure usually consists of writing a pattern of bits to various storage elements on the integrated circuit and reading the pattern back, thus generating a particular pattern as the test result. It is also possible to have a self-test in which a test pattern is generated by internal circuitry on the integrated circuit, such as stepping through each sequential address of a programmable memory and reading the data stored at each addressed location, for comparison with a known list of what should have been stored at each location.

It has generally been necessary in the past to provide dedicated test signal pins which are utilized during testing to carry the test signals and to initiate the test procedure. Because integrated circuits are by nature very, very small, there is a practical physical limit on the number of input and output pins which are available for the integrated circuit. It is therefore desirable to be able to invoke testing without requiring dedicated test signal pins.

It is also desirable to be able to test an integrated circuit while it is in place and soldered to a circuit board. Furthermore it is desirable to be able to completely electrically isolate a particular integrated circuit from other integrated circuits on the circuit board in order to test the remainder of the board without interference from the particular integrated circuit.

SUMMARY OF THE INVENTION

It is a principal object of the present invention to provide an inexpensive method and means for testing integrated circuits without the need for dedicated test signal pins.

It is a further object of the present invention to provide a method and means by which a particular integrated circuit can be electrically isolated from other integrated circuits on a circuit board in order to test the remainder of the board without interference from the particular integrated circuit.

Briefly, the method and means for checking integrated circuits in accordance with a particular embodiment of the present invention is as follows:

Data processing logic is fabricated on an integrated circuit and is outputted to a plurality of output pins. A number of these pins, which are normally function outputs, and a reset input pin, are used to invoke a test state in the integrated circuit. Test control logic is provided on the integrated circuit which generates two test flags. These two test flags are decoded to control all signal output pins from the integrated circuit by the decoder forcing a high-level, low-level, or high impedance condition at the output pins, depending upon the values assigned to the test flags, regardless of the condition of the remaining internal circuitry on the integrated circuit.

In accordance with a further embodiment of the invention, an additional test flag may be used to signal the internal circuitry to initiate a functional self-check operation.

The invention has the advantage that no dedicated test signal pins are required, because the test inputs use normal function output pins and the reset pin to the integrated circuit logic to invoke the test states during testing. The reset input pin also performs the usual function of resetting the logic on the integrated circuit.

The invention has the further advantage that it is possible to test an integrated circuit while it is in place and soldered to a circuit board.

The invention has the further advantage that it is possible to completely electrically isolate a particular integrated circuit from other integrated circuits on the circuit board in order to test the remainder of the board without interference from the particular integrated circuit.

The foregoing and other objects, features, and advantages of the invention will be apparent from the following detailed description of a preferred embodiment of the invention.

DESCRIPTION

Figure 1:
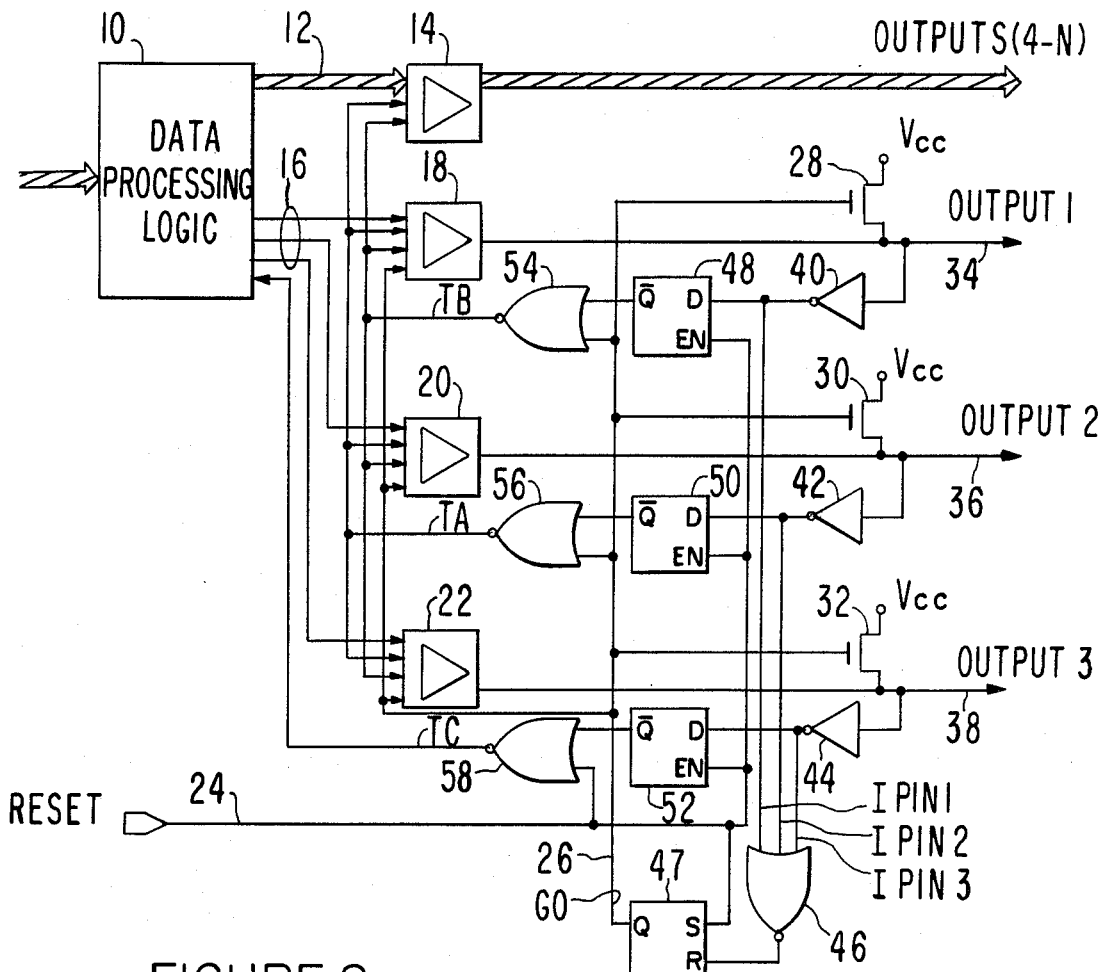
FIG. 1 is a block schematic diagram of an integrated circuit constructed in accordance with the principles of the present invention.

Referring now to FIG. 1, the logic on the integrated circuit comprises data processing logic (10) which includes the internal circuits of a typical integrated circuit. A number of outputs (12) from the data processing logic (10) drive an equal number of output buffers (14). The logic block (14) represents a plurality of general buffer elements. To save space only one buffer (14) is shown, however it is to be understood that there is one such buffer for each output (12). Three additional outputs (16) from the data processing logic (10) drive buffers (18, 20, 22).

Each one of the buffers (14) is controlled by two electrical test flags called TA and TB. The decoded response of each buffer (14) with respect to the signal state of the inputs thereto is shown in the following Table I.

| INPUT | | RESPONSE |
| --- | --- | --- |
| TA | TB | |
| 0 | 0 | Out = Input |
| 1 | 0 | Out = 0 |
| 0 | 1 | Out = 1 |
| 1 | 1 | Out = High Impedance |

The buffers (18, 20, 22) each have a third control input, connected to the signal GO (26), that disables the buffer output independently of other inputs when the master reset pin (24) is asserted high. The purpose of this is to disable any signals on the three outputs (output 1, output 2, output 3) from the buffers (18, 20, 22) before the signals TA and TB are established.

The decoded response of buffers (18, 20, 22) with respect to the signal state of their inputs is shown in the following Table II.

TABLE II

| INPUT | | | |
|---|---|---|---|
| TA | TB | GO | RESPONSE |
| 0 | 0 | 0 | Out = In |
| 1 | 0 | 0 | Out = 0 |
| 0 | 1 | 0 | Out = 1 |
| 1 | 1 | 0 | Out = High Impedance |
| X | X | 1 | Out = 1, Moderately High Impedance |

Activation of the reset pin (24) first sets latch (47), the output of which activates the GO signal (26). GO turns the three output buffers (18, 20, 22) off and activates three moderately high impedance pull-up devices (28, 30, 32) which pull the output pins (34, 36, 38) high and hold them there. These devices are such that a stronger pull-down supplied by an external source on the outputs (34, 36, 38) will be able to pull down these outputs.

Input buffers (40, 42, 44) monitor the output pins (34, 36, 38) and generate the signals IPIN 1, IPIN 2, and IPIN 3, which drive a NOR cicuit (46) and the inputs to three D-latches (48, 50, 52). The D-latches (48, 50, 52) accept the values presented by the signals IPIN 1, IPIN 2, and IPIN 3 when they are enabled by the active high reset signal. The high-to-low transistion of reset latches these values into the three D-latches (48, 50, 52).

Referring now to the timing diagram of FIG. 2, the operation of the circuitry is as follows. All logic blocks are first initialized by a high signal asserted on the reset pin. The high level on reset enables the three latches (48, 50, 52) that monitor the test pin states, forces signal TC low via NOR gate 58, and forces the signal GO (26) to a high level by resetting latch (47). The high level on GO turns off the output buffer drivers (18, 20, 22) to the three test pins (34, 36, 38), which are also output pins. The signal GO also activates the three test pin pull-up devices (28, 30, 32) and forces the two internal test circuits (TA, TB) low via NOR circuits (54, 56). This corresponds to State 1 of the timing diagram of FIG. 2.

The desired system test is now commanded by pulling down any of the test pins (34, 36, 38) and latching this information by returning the reset signal (24) low. This corresponds to State 3 in the timing diagram of FIG. 2.

Figure 2:
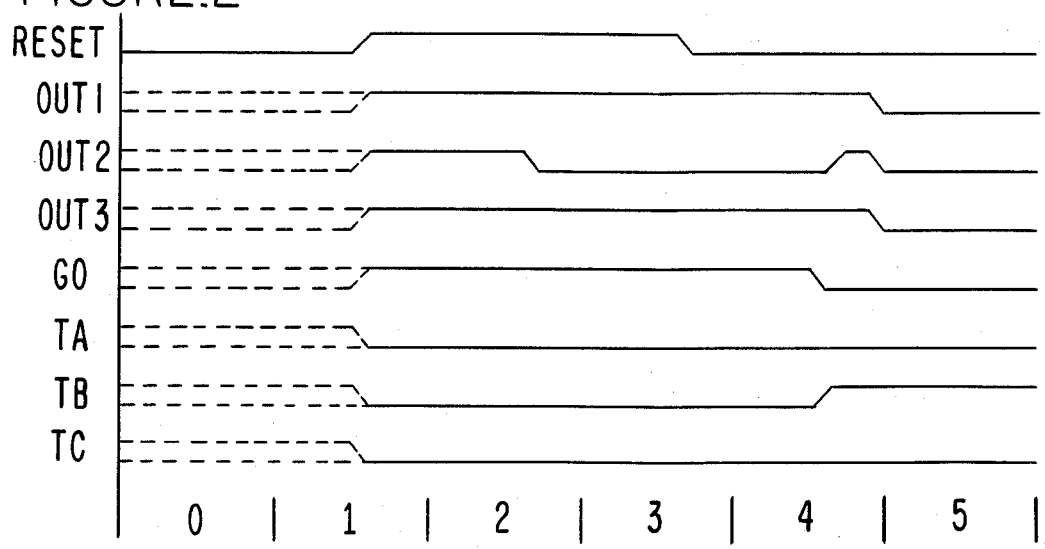
FIG. 2 is a timing diagram of the various signal lines of the logic shown in FIG. 1.

The high GO input (26) enables the weak pull-up transistors (28, 30, 32) which return all three test pins to a high impedance (State 4 of FIG. 2). This high state causes an output from the NOR circuit (46) which resets the latch (47) thus lowering the GO output (26).

If the test pin (38) is selected, the control signal TC (60) becomes high at this time. In this mode of operation, TC signals the internal data processing logic (10) to begin a self-test functional routine.

Once the self-test operation is initiated, external devices are disconnected. The internal electrical pull-ups (28, 30, 32) return the signals (34, 36, 38) high, activating the NOR gate 46, thus resetting latch (47) which deactivates the signal GO. The low GO signal disconnects the weak pull-ups (34, 36, 38) and reactivates the output buffers (18, 20, 22). The self-test routine now runs to completion without interference from the hereindescribed circuits.

Selection of any other test operation directly affects all output devices including the test pin outputs (34, 36, 38) themselves, thus these operations cannot occur until the external test selection circuitry is disconnected.

Operation is as follows: The GO input (26) had previously enabled the weak pull-up transistors (28, 30, 32). These devices return any active low test pin to a logical high when the external pull-down is disconnected. All three test output pins will be high when all external devices are disconnected. This condition is sensed by NOR gate 46, the output of which resets the latch (47). This causes the signal GO to be deactivated via the reset of latch (47). The high-to-low transition of GO (26) disables the weak pull-up to the transistors (28, 30, 32), allows TA and TB to reflect the latched input information in latches (48, 50, 52), and enables the output buffers (18, 20, 22). TA low and TB high in the example of FIG. 2 forces all outputs (1−N) low including the three test pins themselves (State 5), in accordance with the truth table (Table II). This final state is cleared by reasserting the reset pin to thus end the test operation.

The logic which has just been described will invoke test operations on a complex integrated circuit without using any pins as dedicated test inputs and without utilizing any electrical conditions not specified for normal operation of the device. The circuitry can force all output buffer pull-down transistors active regardless of the internal logic state. It can also force all output buffer pull-up transistors active regardless of the internal logic state. Finally, it can force all output buffer transistors inactive regardless of the internal logic state.

It will be readily apparent to those skilled in the art that a signal line may be asserted high or asserted low, with a positive or negative voltage thereon, or with current flowing or not flowing, with line driving circuits energized or not energized, depending upon the convention chosen for a particular design implementation. Therefore it is to be understood that the terms "assert," "asserted," "assertion," "asserting," "disassert," "disasserted," "disassertion," and "disasserting" as used throughout this specification and claims, in reference to input and output lines, mean that the line is asserted either high or low, so long as the same convention is maintained throughout.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. In an integrated circuit having data processing logic thereon, said data processing logic having a plurality of logic outputs, said integrated circuit further having a plurality of integrated circuit inputs including a reset input, and a plurality of integrated circuit outputs, the improvement comprising:

test control logic means, connected to a number of said integrated circuit outputs on said integrated circuit, for generating a test signal state on test control logic outputs in response to test signals on said number of said integrated circuit outputs, said test signals being inputted on said number of said integrated circuit outputs from an external source; and, decoding means connected to said logic outputs of said data processing logic, to said number of integrated circuit outputs and to said test control logic outputs, for decoding said test signal state, said decoding means including controlling means for controlling said number of integrated circuit outputs, depending upon said test signal state.

2. The combination in accordance with claim 1 wherein said test control logic means includes means connected to said data processing logic for generating a test flag, in response to at least one of said test signals, said test flag being usable by said data processing logic to initiate a functional self-check operation.

3. The combination in accordance with claim 1 wherein said controlling means includes means for controlling said integrated circuit outputs by forcing a high-level condition at said integrated circuit outputs, depending upon a first value of said test signal state.

4. The combination in accordance with claim 2 wherein said controlling means includes means for controlling said integrated circuit outputs by forcing a high-level condition at said integrated circuit outputs, depending upon a first value of said test signal state.

5. The combination in accordance with claim 1 wherein said controlling means includes means for controlling said integrated circuit outputs by forcing a low-level condition at said integrated circuit outputs, depending upon a second value of said test signal state.

6. The combination in accordance with claim 2 wherein said controlling means includes means for controlling said integrated circuit outputs by forcing a low-level condition at said integrated circuit outputs, depending upon a second value of said test signal state.

7. The combination in accordance with claim 1 wherein said controlling means includes means for controlling said integrated circuit outputs by forcing a high impedance condition at said integrated circuit outputs, depending upon a third value of said test signal state.

8. The combination in accordance with claim 2 wherein said controlling means includes means for controlling said integrated circuit outputs by forcing a high impedance condition at said integrated circuit outputs, depending upon a third value of said test signal state.

9. In an integrated circuit having data processing logic thereon, said data processing logic having a plurality of logic outputs, said integrated circuit further having a plurality of integrated circuit inputs including a reset input, and a plurality of integrated circuit outputs, the improvement comprising:

first means connected to a number of said plurality of integrated circuit outputs, to a number of said data processing logic outputs, and to said reset input for disabling said number of integrated circuit outputs, in response to assertion of said reset input, so that data on said number of logic outputs cannot reach said number of integrated circuit outputs;

second means connected to said data processing logic, and to at least one of said number of said plurality of integrated circuit outputs for providing a test flag to said integrated circuit in response to assertion of at least one of said number of integrated circuit outputs; and, third means connected to said first and second means, said third means including latch means for latching said test signals, in response to a first signal applied to said reset input, to thereby store a test signal state;

said first means including decoding means connected to said data processing logic outputs, to said plurality of integrated circuit outputs and to said third means, for decoding said test signal state, said decoding means including controlling means for controlling said integrated circuit outputs, depending upon said test signal state, regardless of the condition of said logic outputs;

said third means including fourth means connected to said latch means and to said reset input, responsive to a second signal on said reset input for unlatching said latch means, to thereby clear said test signal state.

10. The combination in accordance with claim 9 wherein said controlling means includes means for controlling said integrated circuit outputs by forcing a high-level condition at said integrated circuit outputs, depending upon a first value of said test signal state.

11. The combination in accordance with claim 9 wherein said controlling means includes means for controlling said integrated circuit outputs by forcing a low-level condition at said integrated circuit outputs, depending upon a second value of said test signal state.

12. The combination in accordance with claim 9 wherein said controlling means includes means for controlling said integrated circuit outputs by forcing a high impedance condition at said integrated circuit outputs, depending upon a third value of said test signal state.

13. The combination in accordance with claim 9 wherein said second means includes means for generating a test flag, in response to assertion of at least one of said number of integrated circuit outputs with test signals thereon, said test flag being usable by said data processing logic to initiate a functional self-check operation; and wherein said latch means includes fifth means connected to said reset input, responsive to said reset input for to thereby clear said test signal state.

14. The method of testing a checking integrated circuit having data processing logic thereon, a plurality of inputs including a reset input, and a plurality of outputs, said method comprising the steps of:

asserting said reset input;

disabling the outputs of said integrated circuit, in response to said assertion of of said reset input, so that data from said data processing logic cannot reach said outputs;

asserting a number of said plurality of outputs with test signals thereon to provide test signal inputs to said integrated circuit to thereby provide test signals for said data processing logic;

disasserting said reset input;

storing the state of said test signals, in response to said disassertion of said reset input;

disasserting said number of said plurality of outputs, thereby removing said test signal inputs;

enabling said outputs of said integrated circuit in selected electrical states, in response to said disassertion of said reset input and in accordance with said stored test signal state;

reasserting said reset input; and, clearing the state of said test signals, in response to said reassertion of said reset input.

* * * * *